United States Patent
Lin et al.

(10) Patent No.: US 11,601,099 B1
(45) Date of Patent: Mar. 7, 2023

(54) MULTI-STAGE WIDE-BAND AMPLIFIER WITH INTRA-STAGE AND INTER-STAGE INDUCTIVE COUPLING

(71) Applicant: Realtek Semiconductor Corp., Hsinchu (TW)

(72) Inventors: Chia-Liang (Leon) Lin, Fremont, CA (US); Ting-Hsu Chien, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/462,192

(22) Filed: Aug. 31, 2021

(51) Int. Cl.
  *H03F 1/42* (2006.01)
  *H03F 3/16* (2006.01)
  *H03F 3/45* (2006.01)

(52) U.S. Cl.
  CPC .................. *H03F 1/42* (2013.01); *H03F 3/16* (2013.01); *H03F 2200/36* (2013.01)

(58) Field of Classification Search
  CPC ........... H03F 1/42; H03F 3/16; H03F 2200/36
  USPC .................................. 330/252–261, 310, 277
  See application file for complete search history.

(56) References Cited

U.S. PATENT DOCUMENTS 8,264,278 B2 * 9/2012 Kanda ..................... H03F 3/211
   330/54

* cited by examiner

*Primary Examiner* — Hieu P Nguyen
(74) *Attorney, Agent, or Firm* — McClure, Qualey & Rodack, LLP

(57) ABSTRACT

A multi-stage amplifier includes a first stage comprising a first common-source amplifier, a first inductive load network comprising a serial connection of a first load resistor and a first load inductor, and a first source network configured to receive a first signal and output a first load signal, and a first inter-stage inductor configured to couple the first load signal to a second signal; and a second stage comprising a second common-source amplifier, a second inductive load network comprising a serial connection of a second load resistor and a second load inductor, and a second source network configured to receive the second signal and output a second load signal, and a second inter-stage inductor configured to couple the second load signal to a third signal, wherein the first load inductor and the second load inductor are laid out to enhance an inter-stage inductive coupling.

20 Claims, 3 Drawing Sheets

MULTI-STAGE WIDE-BAND AMPLIFIER WITH INTRA-STAGE AND INTER-STAGE INDUCTIVE COUPLING

BACKGROUND OF THE DISCLOSURE

Field of the Disclosure

This present disclosure generally relates to multi-stage wide-band amplifier, and particularly to multi-stage wide-band amplifier with intra-stage and inter-stage inductive coupling.

Description of Related Art

A conventional multi-stage amplifier comprises a plurality of stages including a first stage, a second stage, and so on, configured in a cascade topology to achieve a high overall gain, wherein the first stage receives a first signal and output a second signal, the second stage receives the second signal and output a third signal, and so on. Using more stages may allow a higher overall gain, but also reduce an overall bandwidth, since each of the stages is band-limited, as is the case for any practical circuit. In other words, adding an additional stage can lead to an increase of an overall gain, but it causes a reduction in an overall bandwidth due to a limited bandwidth of said additional stage.

What is desired is a multi-stage amplifier that allows an increase in an overall gain without sacrificing an overall bandwidth when using an additional stage.

SUMMARY OF THE DISCLOSURE

In an embodiment, a multi-stage amplifier comprises: a first stage comprising a first common-source amplifier, a first inductive load network comprising a serial connection of a first load resistor and a first load inductor, and a first source network configured to receive a first signal and output a first load signal, and a first inter-stage inductor configured to couple the first load signal to a second signal; and a second stage comprising a second common-source amplifier, a second inductive load network comprising a serial connection of a second load resistor and a second load inductor, and a second source network configured to receive the second signal and output a second load signal, and a second inter-stage inductor configured to couple the second load signal to a third signal, wherein a part of the first load inductor is laid out adjacent to and parallel with a part of the first inter-stage inductor, a part of the second load inductor is laid out adjacent to and parallel with a part of the second inter-stage inductor, and a part of the first load inductor is laid out adjacent to and parallel with a part of the second load inductor.

In an embodiment, a multi-stage amplifier comprises: a first stage comprising a first common-source amplifier, a first inductive load network comprising a serial connection of a first load resistor and a first load inductor, and a first source network configured to receive a first signal and output a first load signal, and a first inter-stage inductor configured to couple the first load signal to a second signal; and a second stage comprising a second common-source amplifier, a second inductive load network comprising a serial connection of a second load resistor and a second load inductor, and a second source network configured to receive the second signal and output a second load signal, and a second inter-stage inductor configured to couple the second load signal to a third signal, wherein: the first load inductor and the first inter-stage inductor are laid out to enhance a first intra-stage inductive coupling, the second load inductor and the second inter-stage inductor are laid out to enhance a second intra-stage inductive coupling, and the first load inductor and the second load inductor are laid out to enhance an inter-stage inductive coupling.

DETAILED DESCRIPTION OF THIS DISCLOSURE

Figure 1:
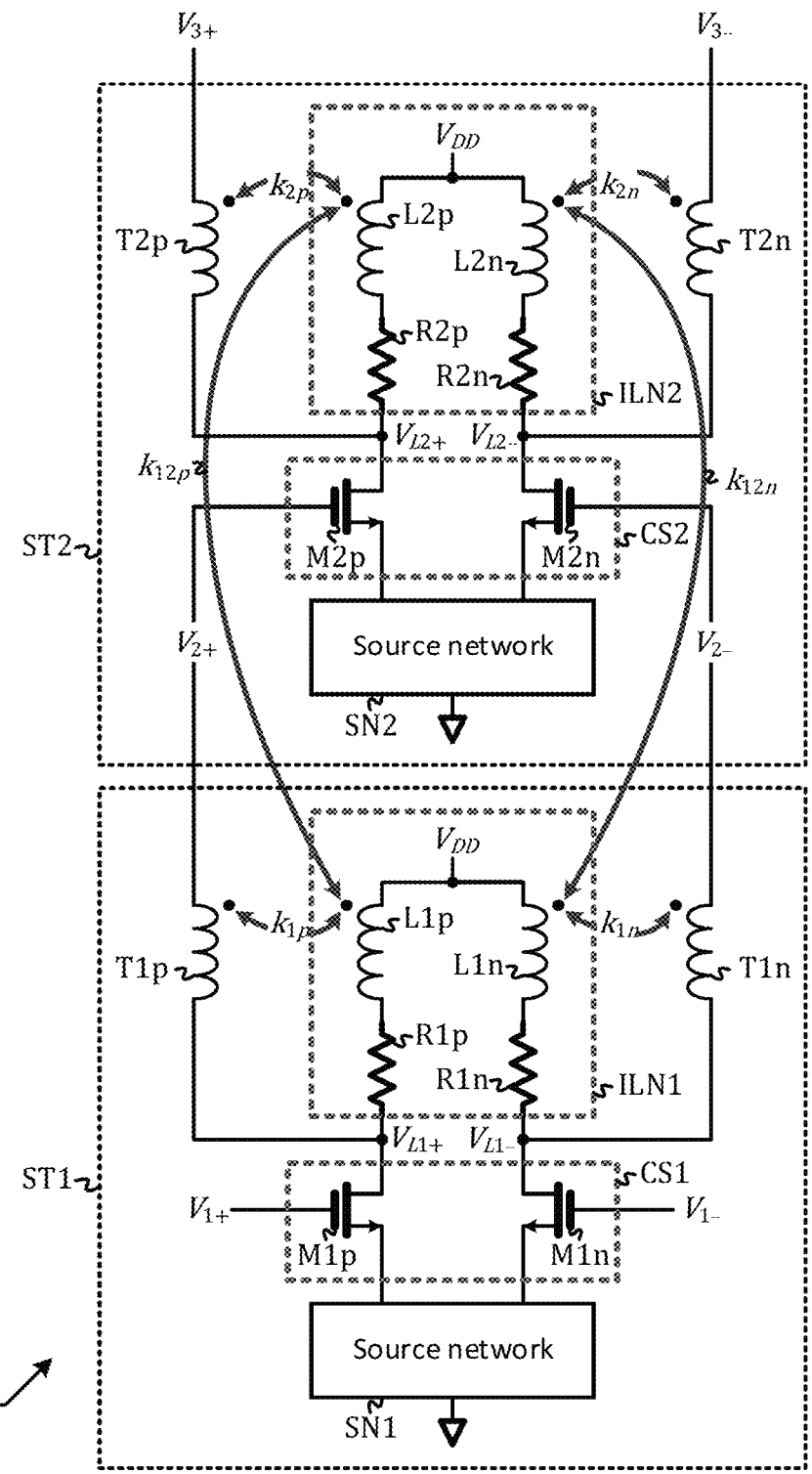
FIG. 1 shows a schematic diagram of a multi-stage amplifier in accordance with an embodiment of the present disclosure.

The present disclosure is directed to multi-stage amplifier. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "differential signal," "gain," "bias," "current source," "impedance," "inductor," "capacitor," "resistor," "inductive coupling," "common-source amplifier," "transconductance," "load," "source degeneration," "parallel connection," "poly-silicon," "via," "circuit node," "ground," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art understand units such as nH (nano-Henry), pH (pico-Henry), fF (femto-Farad), nm (nanometer), and m (micron) without a need of explanations.

Those of ordinary skills in the art can read schematics of a circuit comprising electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A MOS transistor, PMOS or NMOS, has a threshold voltage. A MOS transistor is turned on when its gate-tosource voltage is larger than its threshold voltage (in absolute value). When a MOS transistor is turned on, a difference between its gate-to-source voltage and its threshold voltage in absolute value is referred to as an "over-drive voltage." A MOS transistor is in a "saturation region" when it is turned on and its over-drive voltage is larger than its drain-to-source voltage (in absolute value). A MOS transistor is an effective gain device only when it is in the "saturation region."

A circuit is a collection of one or more transistors, capacitors, resistors, and/or other electronic devices interconnected in a certain manner to embody or implement a certain function.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment. In this present disclosure, "signal" and "voltage signal" refer to the same thing and thus are interchangeable.

Throughout this disclosure, a differential signaling scheme is widely used. When embodied in a differential signaling scheme, a signal comprises two voltages denoted with suffixes "+" and "−," respectively, attached in subscript, and a value of the signal is represented by a difference between said two voltages. For instance, a signal $V_1$ ($V_2$) in a differential signaling embodiment comprises two voltages $V_{1+}$ ($V_{2+}$) and $V_{1-}$ ($V_{2-}$) and a value of the signal $V_1$ ($V_2$) is represented by a difference between $V_{1+}$ ($V_{2+}$) and $V_{1-}$ ($2_{c-}$). $V_{1+}$ ($V_{2+}$) is said to be a first end of $V_1$ ($V_2$); $V_{1-}$ ($V_{2-}$) is said to be a second end of $V_1$ ($V_2$); the first end is also referred to as a positive end; the second end is also referred to as a negative end. A mean value of a first end and a second end of a signal in a differential signal embodiment is referred to as a "common-mode" voltage of said signal.

A common-source amplifier comprises a MOS transistor (either a NMOS transistor or a PMOS transistor) configured to receive an input voltage at a gate (of the MOS transistor) and output an output voltage to a load network connected to a drain (of the MOS transistor) in accordance with a biasing condition determined by a source network connected to a source (of the MOS transistor). A gain of the common-source amplifier is defined by a ratio between an amplitude of the output voltage and an amplitude of the input voltage and is determined collectively by the source network, the load network, a size of the MOS transistor, and a biasing condition. Mathematically, the gain can be expressed as:

$$G = \frac{-g_m Z_{load}}{1 + g_m Z_{source}} \quad (1)$$

Here, G denotes the gain of the common-source amplifier, $g_m$ denotes a transconductance of the common-source amplifier, and Z source denotes an impedance of the source network, and $Z_{load}$ denotes an impedance of the load network. A larger impedance of the load network leads to a higher gain, while a larger impedance of the source network leads to a lower gain. Likewise, a smaller impedance of the load network leads to a lower gain, while a smaller impedance of the source network leads to a higher gain.

Figure 2:
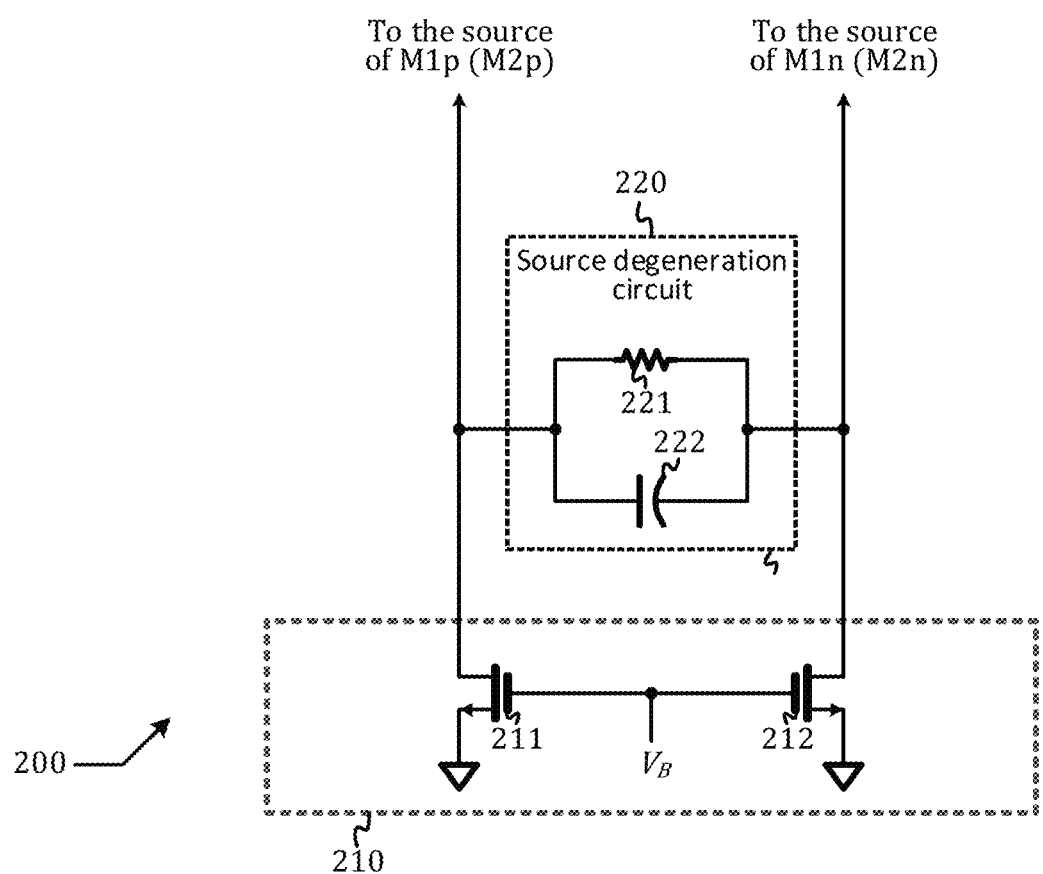
FIG. 2 shows a schematic diagram of a source network for the multi-stage amplifier of FIG. 1 in accordance with an embodiment of the present disclosure.

A schematic diagram of a multi-stage amplifier 100 in accordance with an embodiment of the present disclosure is shown in FIG. 1. Multi-stage amplifier 100 comprises a plurality of stages including a first stage ST1, a second stage ST2, and so on, configured in a cascade topology. For brevity, only two stages (i.e., the first stage ST1 and the second stage ST2) are shown in FIG. 2, since it is clear to those of ordinary skill in the art how to follow the principle to be explained and extend to more than two stages. Throughout this disclosure, "$V_{DD}$" denotes a power supply node. For brevity, hereafter the first (second) stage ST1 (ST2) is simply referred to as ST1 (ST2). ST1 receives a first signal $V_1$ (comprising two voltages $V_{1+}$ and $V_{1-}$ in a differential signal embodiment) and output a second signal $V_2$ (comprising two voltages $V_{2+}$ and $V_{2-}$ in a differential signal embodiment), while ST2 receives the second signal $V_2$ and output a third signal $V_3$ (comprising two voltages $V_{3+}$ and $V_{3-}$ in a differential signal embodiment). ST1 comprises a first common-source amplifier CS1, a first source network SN1, and a first inductive load network ILN1; while ST2 comprises a second common-source amplifier CS2, a second source network SN2, and a second inductive load network ILN2. For brevity, hereafter: the first (second) common-source amplifier CS1 (CS2) is simply referred to as CS1 (CS2); the first (second) source network SN1 (SN2) is simply referred to as SN1 (SN2); the first (second) inductive load network ILN1 (ILN2) is simply referred to as ILN1 (ILN2); and the first (second, third) signal $V_1$ ($V_2$, $V_3$) is simply referred to as $V_1$ ($V_2$, $V_3$). CS1 receives $V_1$ and outputs a first load signal $V_{L1}$ (comprising two voltages $V_{L1+}$ and $V_{L1-}$ in a differential signal embodiment) across ILN1, while CS2 receives $V_2$ and outputs a second load signal $V_{L2}$ (comprising two voltages $V_{L2+}$ and $V_{L2-}$ in a differential signal embodiment) across ILN2. For brevity, hereafter, the first (second) load signal $V_{L1}$ ($V_{L2}$) is simply referred to as $V_{L1}$ ($V_{L2}$). CS1 (CS2) comprises two NMOS transistors M1p (M2p) and M1n (M2n) configured to receive $V_{1+}$ ($V_{2+}$) and $V_{1-}$ ($V_{2-}$) and output $V_{L1+}$ ($V_{L2+}$) and $V_{L1-}$ ($V_{L2-}$), respectively. ST1 further comprises a first pair of inter-stage inductors T1p and T1n configured to connect $V_{L1+}$ and $V_{L1-}$ to $V_{2+}$ and $V_{2-}$, respectively. ST2 further comprises a second pair of inter-stage inductors T2p and T2n configured to connect $V_{L2+}$ and $V_{L2-}$ to $V_{3+}$ and $V_{3-}$, respectively. ILN1 (ILN2) comprises a first (second) pair of load resistors R1p (R2p) and R1n (R2n) and a first (second) pair of load inductors L1p (L2p) and L1n (L2n). It is clear to those of ordinary skill in the art that, an impedance of ILN1 (INL2) and consequently a gain of CS1 (CS2) increase as a frequency of $V_{L1}$ ($V_{L2}$) increases.

In an embodiment, the multi-stage amplifier 100 is fabricated on a silicon substrate as integrated circuits. There are eight inductors shown in FIG. 1: L1p, L1n, T1p, T1n, L2p, L2n, T2p, and T2n. L1p (L1n) and T1p (Tin) are laid out closely to have a strong intra-stage inductive coupling represented by an intra-stage coupling coefficient $k_{1p}$ ($k_{1n}$); L2p (L2n) and T2p (T2n) are laid out closely to have a strong intra-stage inductive coupling represented by an intra-stage coupling coefficient $k_{2p}$ ($k_{2n}$); and ST1 and ST2 are laid out closely so that L1p (L1n) and L2p (L2n) can have a strong inter-stage inductive coupling represented by an inter-stage coupling coefficient $k_{12p}$ ($k_{12n}$).

A schematic of a source network 200 that can be instantiated to embody SN1 (SN2) is shown in FIG. 2. Source network 200 comprises: a current source 210 comprising two NMOS transistors 211 and 212 configured to output currents to the source of M1p (M2p) and the source of M1n (M2n), respectively, in accordance with a bias voltage $V_B$; and a source degeneration circuit 220 comprising a parallel connection of a resistor 221 and a capacitor 222. Current source 210 is used to bias NMOS transistors M1p (M2p) and M1n (M1n) in a saturation region so that CS1 (CS2) can effectively function as a common-source amplifier. Source degeneration circuit 220 is used to establish an impedance of the source network 200 and thus affect a gain of CS1 (CS2). In a special case wherein the source network 200 has a nearly zero impedance and CS1 (CS2) has a maximum gain, capacitor 222 is removed, and resistor 221 is replaced by a short circuit. In an embodiment, at least one of resistor 221 and capacitor 222 is tunable, and therefore the impedance of the source network 200 and consequently the gain of CS1 (CS2) is tunable. Source network 200 is clear to those of ordinary skill in the art and thus is not further explained. Concepts of "tunable resistor" and "tunable capacitor" are also well understood by those of ordinary skill in the art and thus not explained in detail.

By way of example but not limitation, multi-stage amplifier 100 is fabricated on a silicon substrate using a 12 nm CMOS (complementary metal oxide semiconductor) process technology that allows a circuit designer to integrate a plurality of circuits using a multi-layer structure that comprises a first thick metal layer (hereafter TM1 for short), a second thick metal layer (hereafter TM2 for short), a "TM1-TM2 via" layer for inter-connection between TM1 and TM2, a poly-silicon layer, a plurality of thin metal layers along with a plurality of inter-layer connection vias, and a plurality of active device layers pertaining to fabricating active devices (such as NMOS transistors and PMOS transistors); concepts of using a multi-layer structure comprising a plurality of layers, metal and/or poly-silicon and/or active device, along with a plurality of inter-layer connection vias to integrate a plurality of circuits on a silicon substrate using a CMOS process technology are well understood by those of ordinary skill in the art and thus not described in detail here. $V_{DD}$ is 0.9V; a frequency range of interest is between 10 MHz and 13 GHz; L1$p$, L1$n$, L2$p$, and L2$n$ are 1.35 nH; R1$p$, R1$n$, R2$p$, and R2$n$ are 220-Ohm; T1$p$, T1$n$, T2$p$, and T2$n$ are 200 pH; resistor 221 is 100-Ohm; capacitor 222 is 50 fF; and W/L (which stands for width/length) is 5·m/12 nm.

Figure 3:
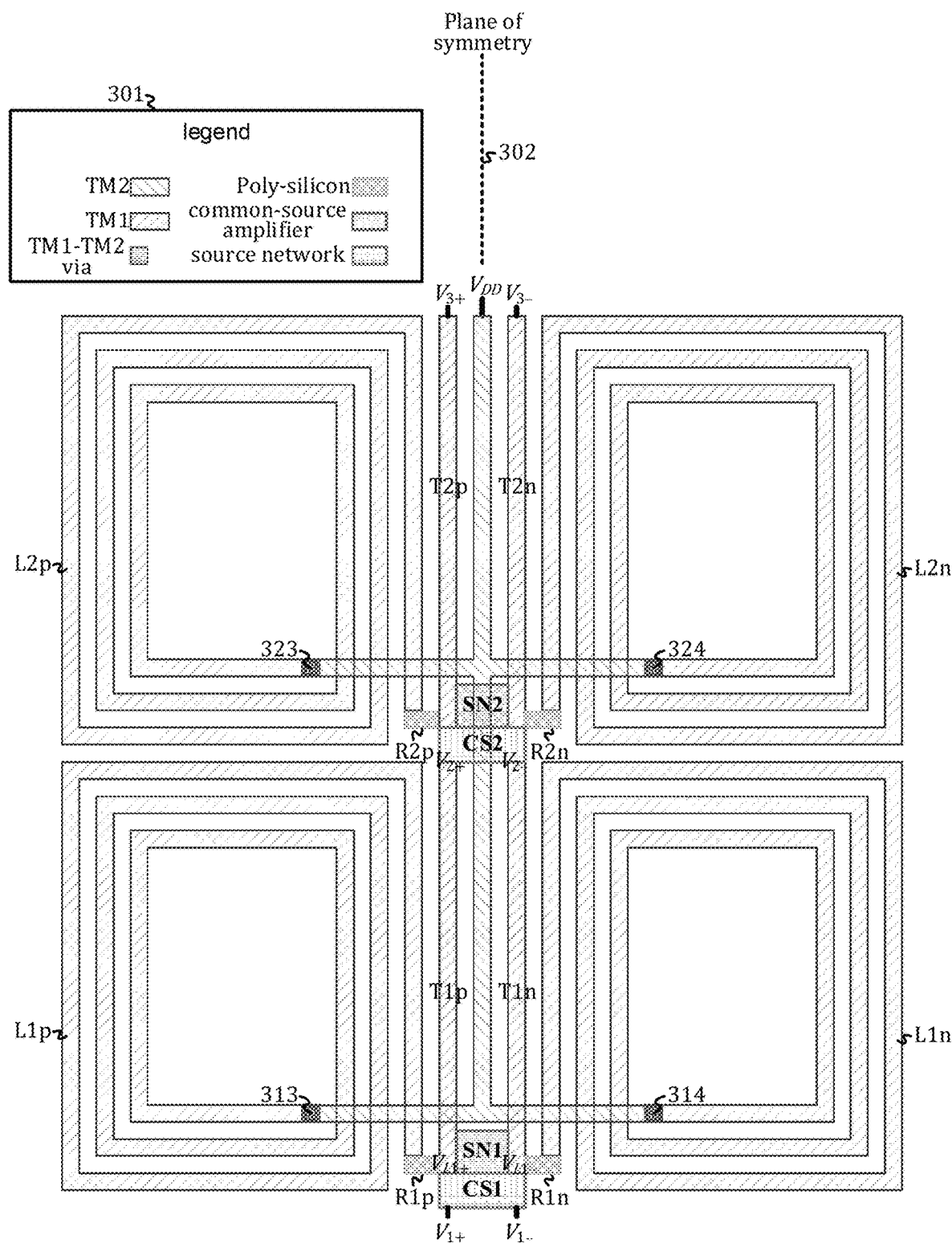
FIG. 3 shows a top view of a layout of the multi-stage amplifier of FIG. 1 in accordance with an embodiment of the present disclosure.

A top view of a layout of multi-stage amplifier 100 is shown in FIG. 3. A legend is shown in box 301. As shown, multi-stage amplifier 100 is laid out to be symmetrical with respect to a plane of symmetry 302 (which is perpendicular to the multi-layer structure and appears to be line as seen from the top view). Inductors L1$p$, L1$n$, L2$p$, L2$n$, T1$p$, T1$n$, T2$p$, and T2$n$ are all laid out on TM1. L1$p$, L2$p$, T1$p$, and T2$p$ are mirror images of L1$n$, L2$n$, T1$n$, and T2$n$, respectively, with respect to the plane of symmetry 302. L1$p$, L1$n$, L2$p$, and L2$n$ are all multi-turn spiral inductors. A part of an outer turn of L1$p$ (L1$n$, L2$p$, L2$n$) is adjacent to and parallel with a part of T1$p$ (T1$n$, T2$p$, T2$n$); this leads to a strong inductive coupling and causes the intra-stage coupling coefficient $k_{1p}$ ($k_{1n}$, $k_{2p}$, $k_{2n}$) to be large. A part of the outer turn of L1$p$ (Lin) is adjacent to and parallel with a part of the outer turn of L2$p$ (L2$n$); this leads to a strong inductive coupling and causes the inter-stage coupling coefficient $k_{12p}$ ($k_{12n}$) to be large. L1$p$, L1$n$, L2$p$, and L2$n$ are connected to the power supply node $V_{DD}$ through a metal trace laid out on TM2 and vias 313, 314, 323, and 324, respectively. CS1 (CS2), SN1 (SN2), R1$p$ (R2$p$), and R1$n$ (R2$n$) are laid out in proximity for ease of connection. R1$p$ (R1$n$, R2$p$, R2$n$) comprises a poly-silicon trace laid out on the poly-silicon layer and connects to L1$p$ (L1$n$, L2$p$, L2$p$) using a serial connection of a plurality of inter-layer connection vias. CS1 (CS2) is laid out using a plurality of layers pertaining to NMOS transistors and connects to T1$p$ (T2$p$) and T1$n$ (T2$n$) using a serial connection of a plurality of inter-layer connection vias. SN1 (SN2) comprises a poly-silicon trace laid out on the poly-silicon layer (for fabricating a resistor) and a plurality of inter-digitating metal fingers laid out on said plurality of thin metal layers (for fabricating a capacitor) along with a plurality of inter-layer connection vias. By using a strong intra-stage inductive coupling for a stage (ST1 or ST2), the bandwidth of said stage can be extended, since an effective inductance of the inductive load network (ILN1 or ILN2) can be enlarged to boost a high-frequency gain. By using a strong inter-stage inductive coupling, the effective inductance of the inductive network (ILN1 or ILN2) also can be enlarged to further boost a high-frequency gain and thus extend an overall bandwidth, therefore an otherwise reduction of an overall bandwidth due to adding an additional stage can be ameliorated. This allows designers to add an additional stage to achieve a higher overall gain without sacrificing an overall bandwidth.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A multi-stage amplifier comprising:
   a first stage comprising a first common-source amplifier, a first inductive load network comprising a serial connection of a first load resistor and a first load inductor, and a first source network configured to receive a first signal and output a first load signal, and a first inter-stage inductor configured to couple the first load signal to a second signal; and
   a second stage comprising a second common-source amplifier, a second inductive load network comprising a serial connection of a second load resistor and a second load inductor, and a second source network configured to receive the second signal and output a second load signal, and a second inter-stage inductor configured to couple the second load signal to a third signal, wherein:
   a part of the first load inductor is laid out adjacent to and parallel with a part of the first inter-stage inductor, a part of the second load inductor is laid out adjacent to and parallel with a part of the second inter-stage inductor, and a part of the first load inductor is laid out adjacent to and parallel with a part of the second load inductor.

2. The multi-stage amplifier of claim 1, wherein both the first stage and the second stage are fabricated in a multi-layer structure on a silicon substrate using a CMOS (complementary metal oxide semiconductor) process technology.

3. The multi-stage amplifier of claim 2, wherein the multi-layer structure comprises a first thick metal layer, a second thick metal layer, a poly-silicon layer, a plurality of thin metal layers, a plurality of active device layers pertaining to fabricating MOS (metal oxide semiconductor) transistors, and a plurality of inter-layer connection vias.

4. The multi-stage amplifier of claim 3, wherein the first common-source amplifier comprises a first NMOS (n-channel metal oxide semiconductor) transistor and the second common-source amplifier comprises a second NMOS transistor.

5. The multi-stage amplifier of claim 4, wherein: the first NMOS transistor receives the first signal at its gate and outputs the first load signal at its drain in accordance with a bias condition established via its source by the first source network; and the second NMOS transistor receives the second signal at its gate and outputs the second load signal at its drain in accordance with a bias condition established via its source by the second source network.

6. The multi-stage amplifier of claim 5, wherein each of the first source network and the second source network comprises a current source and a source degeneration network.

7. The multi-stage amplifier of claim 6, wherein the source degeneration network comprises a parallel connection of a resistor and a capacitor.

8. The multi-stage amplifier of claim 7, wherein the resistor comprises a poly-silicon trace laid out on the poly-silicon layer.

9. The multi-stage amplifier of claim 7, wherein the capacitor comprises a plurality of inter-digitating metal fingers laid out on said plurality of thin metal layers.

10. The multi-stage amplifier of claim 3, wherein the first load inductor, the second load inductor, the first inter-stage inductor, and the second inter-stage inductor all include at least a portion laid out on the first thick metal layer.

11. The multi-stage amplifier of claim 10, wherein the part of the first load inductor that is adjacent to and parallel with the part of the first inter-stage inductor is laid out on the first thick metal layer.

12. The multi-stage amplifier of claim 10, wherein the part of the second load inductor that is adjacent to and parallel with the part of the second inter-stage inductor is laid out on the first thick metal layer.

13. The multi-stage amplifier of claim 10, wherein the part of the first load inductor that is adjacent to and parallel with the part of the second load inductor is laid out on the first thick metal layer.

14. The multi-stage amplifier of claim 10, wherein a power supply node is connected to the first load inductor using a metal trace laid out on the second thick metal layer and an inter-layer connection via.

15. The multi-stage amplifier of claim 14, wherein the power supply node is connected to the second load inductor using a metal trace laid out on the second thick metal layer and an inter-layer connection via.

16. A multi-stage amplifier comprising:
a first stage comprising a first common-source amplifier, a first inductive load network comprising a serial connection of a first load resistor and a first load inductor, and a first source network configured to receive a first signal and output a first load signal, and a first inter-stage inductor configured to couple the first load signal to a second signal; and
a second stage comprising a second common-source amplifier, a second inductive load network comprising a serial connection of a second load resistor and a second load inductor, and a second source network configured to receive the second signal and output a second load signal, and a second inter-stage inductor configured to couple the second load signal to a third signal, wherein: the first load inductor and the first inter-stage inductor are laid out to enhance a first intra-stage inductive coupling, the second load inductor and the second inter-stage inductor are laid out to enhance a second intra-stage inductive coupling, and the first load inductor and the second load inductor are laid out to enhance an inter-stage inductive coupling.

17. The multi-stage amplifier of claim 16, wherein both the first stage and the second stage are fabricated in a multi-layer structure on a silicon substrate using a CMOS (complementary metal oxide semiconductor) process technology.

18. The multi-stage amplifier of claim 17, wherein the multi-layer structure comprises a first thick metal layer, a second thick metal layer, a poly-silicon layer, a plurality of thin metal layers, a plurality of active device layers pertaining to fabricating MOS (metal oxide semiconductor) transistors, and a plurality of inter-layer connection vias.

19. The multi-stage amplifier of claim 18, wherein enhancing the intra-stage inductive coupling between the first load inductor and the first inter-stage inductor comprises laying out a part of the first load inductor to be adjacent to and parallel with a part of the first inter-stage inductor and enhancing the intra-stage inductive coupling between the second load inductor and the second inter-stage inductor comprises laying out a part of the second load inductor to be adjacent to and parallel with a part of the second inter-stage inductor on the first thick metal layer.

20. The multi-stage amplifier of claim 18, wherein enhancing the inter-stage coupling between the first load inductor and the second load inductor comprises laying out a part of the first load inductor adjacent to and parallel with a part of the second load inductor on the first thick metal layer.

* * * * *